(12) United States Patent
Ishii

(10) Patent No.: US 6,348,723 B1
(45) Date of Patent: Feb. 19, 2002

(54) SEMICONDUCTOR DEVICE WITH A DUMMY WIRE POSITIONED TO PREVENT CHARGING/DISCHARGING OF THE PARASITIC CAPACITANCE OF A SIGNAL WIRE

(75) Inventor: Toshiji Ishii, Sakurai (JP)

(73) Assignee: Sharp Kabushiki Kaisha, Osaka (JP)

( * ) Notice: Subject to any disclaimer, the term of this patent is extended or adjusted under 35 U.S.C. 154(b) by 890 days.

(21) Appl. No.: 08/636,806

(22) Filed: Apr. 23, 1996

(30) Foreign Application Priority Data

Apr. 28, 1995 (JP) ............................. 7-106727

(51) Int. Cl.⁷ ................. H01L 29/00; H01L 23/52; H01L 23/58
(52) U.S. Cl. .............. 257/532; 257/503; 257/920
(58) Field of Search ................. 257/207, 208, 257/503, 506, 532, 920

(56) References Cited

U.S. PATENT DOCUMENTS 4,989,182 A  * 1/1991 Mochizuki et al. ......... 365/210
5,066,997 A  * 11/1991 Sakurai et al. ............... 357/45
5,191,234 A  *  3/1993 Murakami et al. .......... 307/265
5,479,045 A  * 12/1995 Narahara et al. ........... 257/533

FOREIGN PATENT DOCUMENTS

| JP | 53091680 |   | 8/1978 |         |
|----|----------|---|--------|---------|
| JP | 56125868 | * | 10/1981 | ......... 257/67 |
| JP | 58141550 | * | 8/1983  | ......... 257/532 |
| JP | 1214048  |   | 8/1989 |         |
| JP | 2037763  |   | 2/1990 |         |
| JP | 04073951 A |  | 3/1992 |         |
| JP | 4-142074 |   | 5/1992 |         |

* cited by examiner

Primary Examiner—Olik Chaudhuri
Assistant Examiner—Howard Weiss
(74) Attorney, Agent, or Firm—Nixon & Vanderhye, P.C.

(57) ABSTRACT

A semiconductor device according to the present invention includes: a semiconductor substrate; a signal wire, disposed on the semiconductor substrate, for transmitting a signal between circuits; and a dummy wire disposed between the signal wire and the region of the semiconductor substrate to form a parasitic capacitance with the signal wire, wherein a signal, which has the same phase as a phase of a signal supplied to the signal wire, is supplied to the dummy wire.

12 Claims, 7 Drawing Sheets

SEMICONDUCTOR DEVICE WITH A DUMMY WIRE POSITIONED TO PREVENT CHARGING/DISCHARGING OF THE PARASITIC CAPACITANCE OF A SIGNAL WIRE

BACKGROUND OF THE INVENTION

1. Field of the Invention

The present invention relates to a semiconductor device, and in particular a semiconductor device including an insulation gate type field effect transistor.

2. Description of the Related Art

Conventionally, any wiring layer in a semiconductor device is provided on a chip formed on a semiconductor substrate with a thick interlayer insulation film interposed therebetween. The wiring layer may consist of one layer or a plurality of layers.

FIGS. 3A to 3C are diagrams describing the general structure of a conventional semiconductor device. Specifically, FIGS 3A to 3C show a wiring portion of a semiconductor device formed by a process that employs, for example, one polysilicon layer and one metal layer. FIG. 3A is a plan view showing the wiring portion; FIG. 3B is a cross-sectional view taken at view IIIb—IIIb in FIG. 3A; and FIG. 3C is a circuit diagram showing a buffer circuit composed of the wiring shown in FIG. 3A and invertors.

As shown in FIG. 3B, an insulation film 106 is formed on the surface of a semiconductor substrate 104. On the substrate 104, wires 101 and 102 are formed with the insulation film 106 and an interlayer insulation film 105 interposed therebetween. The wire 101 serves as a signal wire through which a signal is transmitted. The wire 102 is connected to ground. In this specification, the wire 102 is referred to as a "grounding wire." The wires 101 and 102 are formed by patterning an aluminum layer formed on the interlayer insulation film 105. Therefore, in a portion where the wires 101 and 102 intersect each other, the wires must be rearranged so that one wire is located above the other so as to interpose the interlayer insulation film 105.

In this conventional example, the wire 101 is disrupted at both sides of the wires 102. The disrupted ends of the wire 101 are connected to a polysilicon wire 103 via contact holes 103a, the polysilicon wire 103 being formed below the wire 101 with the interlayer insulation film 105 interposed therebetween. The polysilicon wire 103 is formed by patterning a polysilicon layer formed on the insulation film 106. The polysilicon wire 103 is formed concurrently with the gates of transistors, etc. The wire 103, which is formed by thus patterning the polysilicon layer, is insulated from the wires 101 and 102 (formed by patterning the above-mentioned aluminum layer) by the interlayer insulation film 105.

Thus, it is ensured that the signal wire 101 and the grounding wire 102 (formed of the patterned aluminum layer) intersect each other in a three-dimensional manner by reconnecting the signal wire 101 to the underlying polysilicon wire 103.

FIG. 3C is a circuit diagram showing a buffer circuit composed of the wires shown in FIG. 3A and invertors 110 and 111. As shown in FIG. 3C, the preceding invertor 110 and the subsequent invertor 111 are interconnected with each other via the above-described signal wire 101. A wiring resistance 107 of the polysilicon wire 103 is present between the invertors 110 and 111.

Since the portion of the signal wire 101 which is composed of the polysilicon wire 103 intersects the grounding wire 102, the signal wire 101 has a parasitic capacitance 108 formed between the polysilicon wire 103 and the aluminum layer functioning as the grounding wire 102 and a parasitic capacitance 109 formed between the polysilicon wire 103 and the semiconductor substrate 104.

FIG. 4 shows a simulated result of the conventional buffer circuit shown in FIG. 3C. By inputting an input signal $B_1$ to the preceding invertor 110, an output signal $B_2$ is obtained from an output node thereof. However, the output signal $B_2$, which corresponds to the input signal $B_1$, is rounded at the output node of the invertor 110, i.e., an input node of the subsequent invertor 111, as shown in FIG. 4. As a result, the waveform of an output signal $B_3$ of the subsequent invertor 111 is delayed with respect to the waveform of the input signal $B_1$.

In an attempt to manufacture semiconductor devices at low cost, semiconductor devices are further miniaturized and the manufacturing processes thereof are simplified, thereby reducing the amount of time required for the production of semiconductor devices. This has resulted in a trend to reduce the thickness of LOCOS layers and films between wire layers (interlayer insulation films). In the structure shown in FIG. 3B, for example, the thicknesses of the interlayer insulation film 105 between the polysilicon wire 103 and the aluminum layer 102 (functioning as the grounding wire) and the insulation film 106 between the polysilicon wire 103 and the semiconductor substrate 104 are to be reduced. However, this results in an increase in the parasitic capacitance which accompanies the signal wire, thereby increasing the delay of signals in such signal wires interconnecting various circuits. As a result, this hinders high-speed signal processing of the device.

In general, the delay time of a signal is determined by the driving ability of a buffer and a time constant, which is a product obtained by multiplying the wiring resistance by the wiring capacitance.

In the circuit configuration shown in FIG. 3C, the delay time of the output signal $B_3$ corresponding to the input signal $B_1$ is determined by a time constant obtained by multiplying the value of the wiring resistance 107 and the sum of the values of the parasitic capacitances 108 and 109. Assuming that the thickness of the film between the wire layers is reduced by one-half by employing a process for further miniaturization, which does not effect the driving ability of the buffer and the values of the wiring resistance 107, the value of the sum of the parasitic capacitances 108 and 109 doubles (because the thickness of the film between the wire layers has been reduced by one-half). The value of the wiring resistance 107 is not changed. As a result, the time constant, which determines the signal delay time, also doubles. Thus, under the condition that the buffer has the same driving ability, the signal delay time doubles by reducing the thickness of the film between the wire layers.

SUMMARY OF THE INVENTION

A semiconductor device according to the present invention includes: a semiconductor substrate; a signal wire, disposed on the semiconductor substrate; for transmitting a signal between circuits; and a dummy wire disposed between the signal wire and a region of the semiconductor substrate to form a parasitic capacitance with the signal wire, wherein a signal, which has the same phase as a phase of a signal supplied to the signal wire, is supplied to the dummy wire.

In one embodiment of the invention, the circuits include at least one transistor including a semiconductor layer, and the signal wire includes a semiconductor portion which is formed simultaneously with the semiconductor layer of at least one transistor.

In another embodiment of the invention, the dummy wire includes an impurity diffusion region formed in a surface of the semiconductor substrate to oppose the semiconductor portion of the signal wire.

In still another embodiment of the invention, the signal wire includes a first conductive portion with an insulating layer interposed between the first conductive portion and the semiconductor portion of the signal wire, the semiconductor portion being electrically connected to the first conductive portion through a first contact hole formed in the insulating layer.

In still another embodiment of the invention, the dummy wire includes a second conductive portion with the insulating layer interposed between the second conductive portion and the impurity diffusion region of the dummy wire, the impurity diffusion region being electrically connected to the second conductive portion through a second contact hole formed in the insulating layer.

In still another embodiment of the invention, the semiconductor device further includes a further wire formed of the same material as the material of the first conductive portion of the signal wire, wherein the further wire is arranged to be located above the semi-conductor portion of the signal wire with the insulating layer interposed therebetween.

Alternatively, a semiconductor device according to the present invention includes: a semiconductor substrate; a first signal processing circuit for receiving an input signal and for outputting a first output signal in accordance with the input signal; a second signal processing circuit for receiving the first output signal and for outputting a second output signal in accordance with the first output signal; a signal wire, disposed on the semiconductor substrate, for connecting the first signal processing circuit to the second signal processing circuit to transmit the first output signal from the first signal processing circuit to the second signal processing circuit; and a dummy wire disposed on the semiconductor substrate substantially parallel to the signal wire, the dummy wire being electrically insulated from the signal wire, wherein a signal supplied to the dummy wire has the same phase as a phase of the first output signal transmitted by the signal wire.

In one embodiment of the invention, the semiconductor device further includes a dummy signal processing circuit having the same configuration as a configuration of the first signal processing circuit, the dummy signal processing circuit receiving the input signal and outputting a third output signal in accordance with the input signal to the dummy wire.

In another embodiment of the invention, the signal wire includes conductive portions which are apart from each other and a connecting portion which connects the conductive portions, the conductive portions being formed on a first conductive layer, the connecting portion being formed of a second conductive layer disposed under the first conductive layer with an insulating layer interposed therebetween, and wherein a further wire, formed on the first conductive layer, is provided above the connecting portion of the signal wire.

Thus, the invention described herein makes possible the advantage of providing a semiconductor device capable of reducing the delay of signals due to an increase in the capacitance of a signal wire caused by a decrease in the thickness of an interlayer insulation film and the like, as is necessitated by the miniaturization of the device or the simplification of the production process thereof, so that high-speed processing is not hindered by such miniaturization of the device or simplification of the process.

This and other advantages of the present invention will become apparent to those skilled in the art upon reading and understanding the following detailed description with reference to the accompanying figures.

BRIEF DESCRIPTION OF THE DRAWINGS

FIG. 1A is a plan view showing a wiring portion of the semiconductor device;

FIG. 1B is a cross-sectional view taken at line Ib—Ib in FIG. 1A; and

FIG. 1C is a circuit diagram showing a buffer circuit in the semiconductor device.

FIG. 3A is a plan view showing a wiring portion of the semiconductor device;

FIG. 3B is a cross-sectional view taken at line IIIb—IIIb in FIG. 3A; and

FIG. 3C is a circuit diagram showing a conventional buffer circuit.

DESCRIPTION OF THE PREFERRED EMBODIMENTS

Hereinafter, the present invention will be described by way of examples, with reference to the accompanying figures.

EXAMPLE 1

Figure 1A:
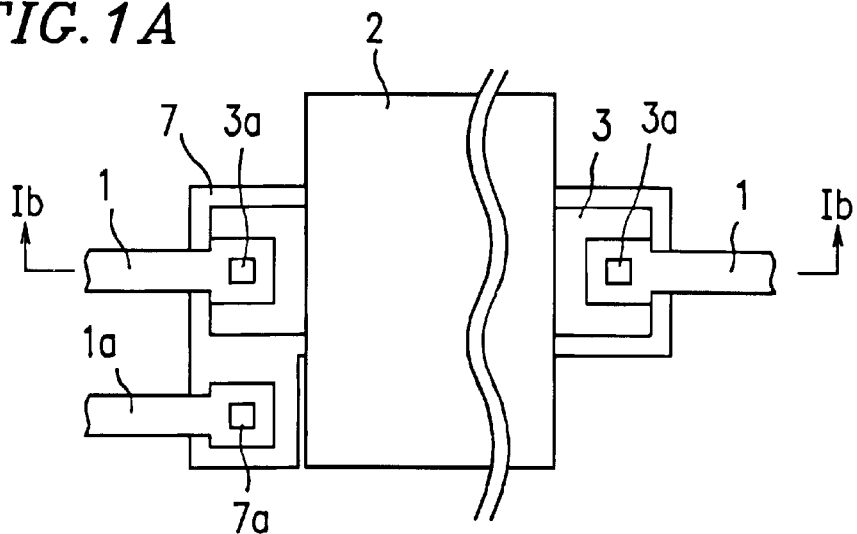
FIGS. 1A to 1C are diagrams describing a semiconductor device according to Example 1 of the present invention.
Figure 1B:
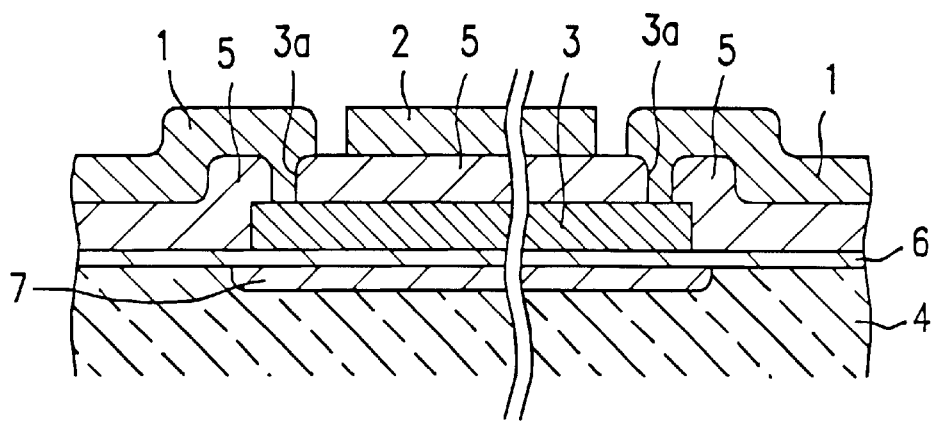
Figure 1C:
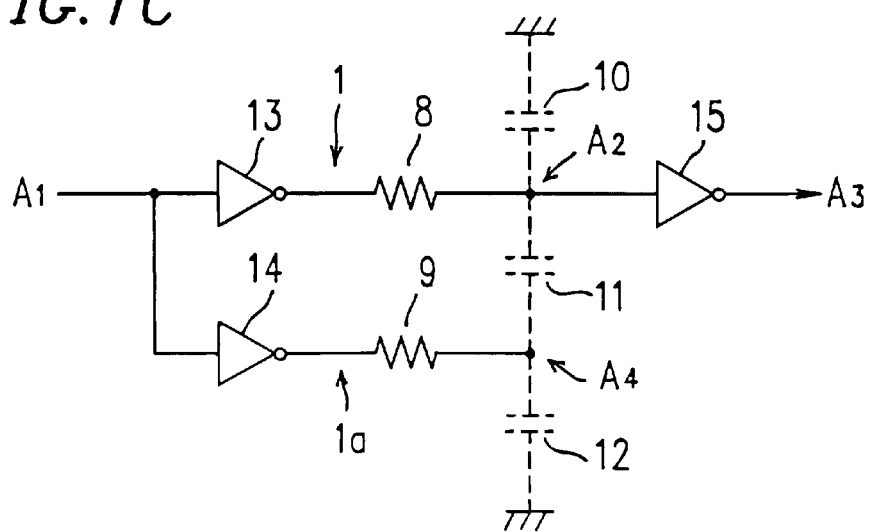

FIGS. 1A to 1C are diagrams describing a semiconductor device according to Example 1 of the present invention. FIG. 1A is a plan view showing a wiring portion of the semiconductor device. FIG. 1B is a cross-sectional view taken at line Ib—Ib in FIG. 1A; and FIG. 1C is a circuit diagram showing a buffer circuit in the semiconductor device.

Figure 3A:
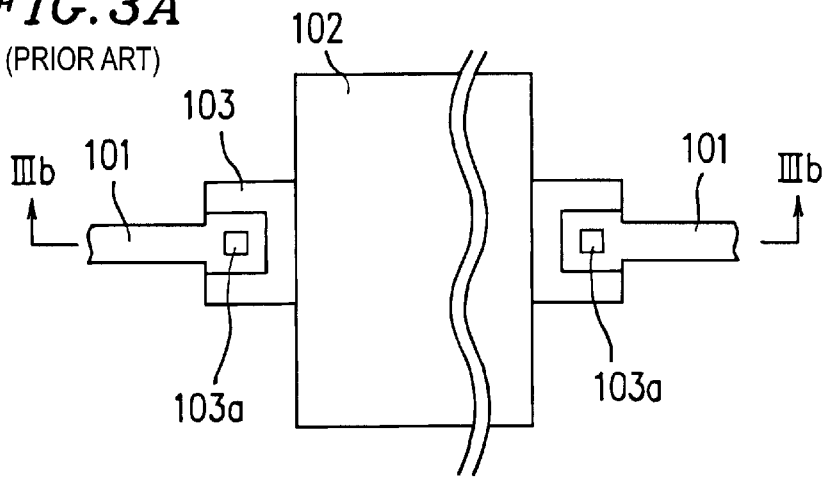
FIGS. 3A to 3C are diagrams describing the general structure of a conventional semiconductor.
Figure 3B:
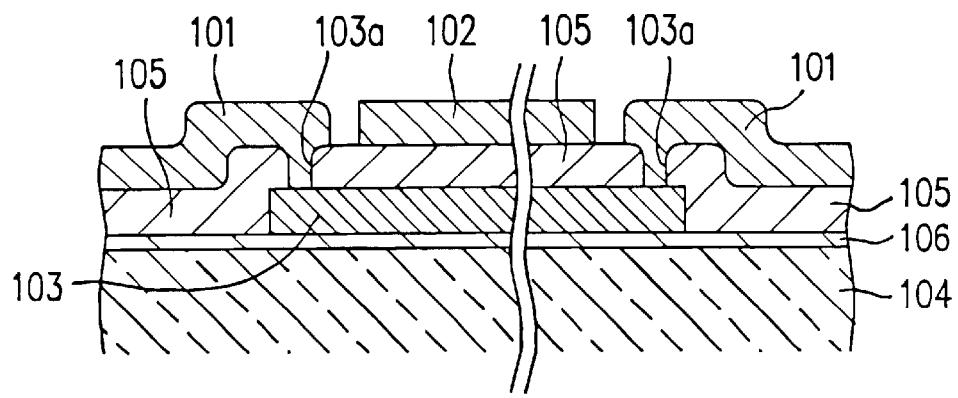
Figure 3C:
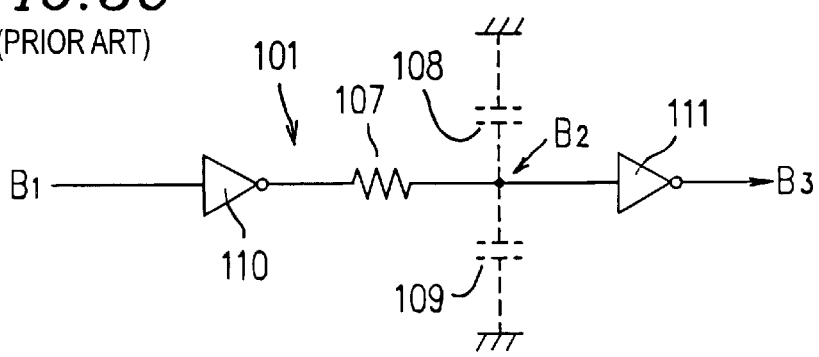
Figure 4:
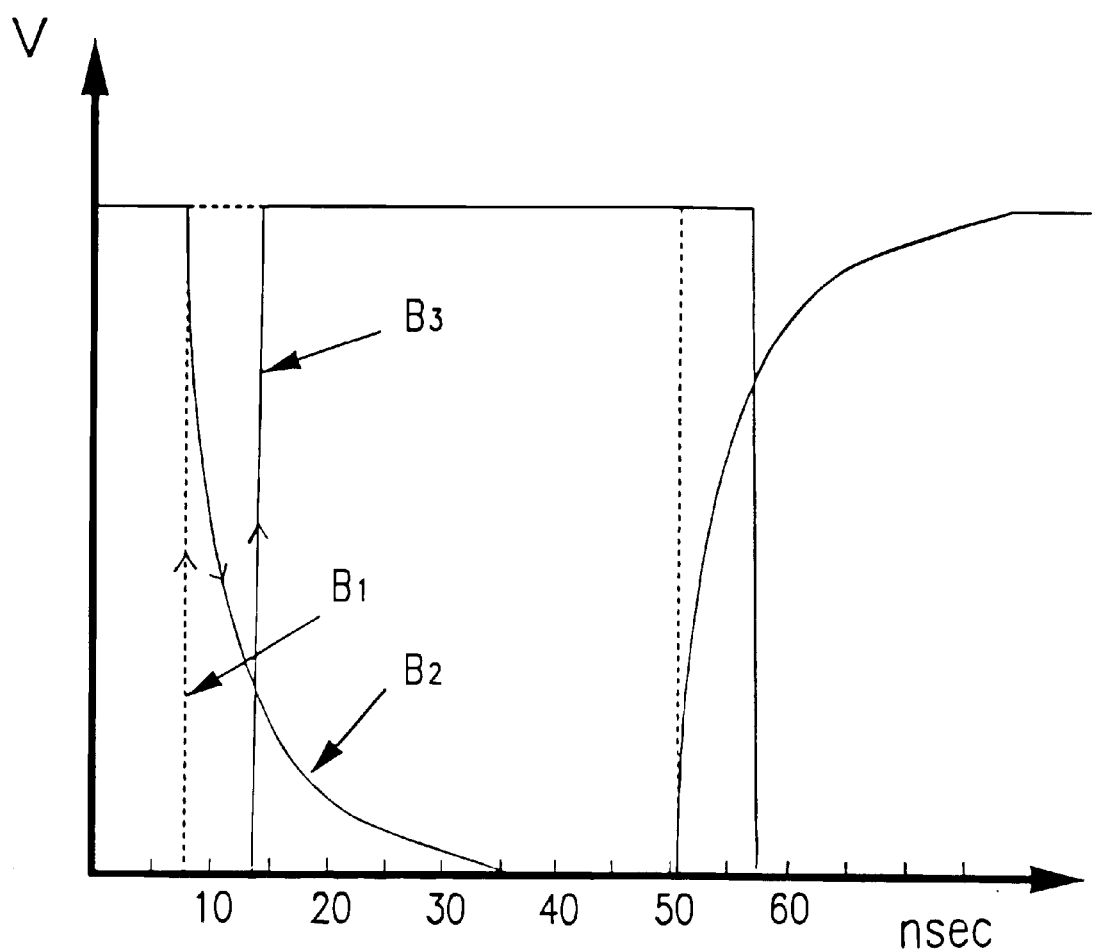
FIG. 4 is a graph showing a simulated result of the conventional buffer circuit shown in FIG. 3C.

As shown in FIG. 1B, a signal wire 1 is formed on a semiconductor substrate 4 with an insulation film 6 and an interlayer insulation film 5 interposed therebetween; and a grounding wire 2 is formed on the semiconductor substrate 4 with the insulation film 6 and the interlayer insulation film 5 interposed therebetween. The signal wire 1 and the grounding wire 2 generally correspond to the signal wire 101 and the grounding wire 102 of the conventional semiconductor device shown in FIGS. 3A to 3C. The signal wire 1 and the grounding wire 2 are ensured to intersect each other in a three-dimensional manner similar to the case of the conventional semiconductor device shown in FIGS. 3A to 3C.

In short, the wires 1 and 2 are formed by patterning an aluminum (Al) layer formed on the interlayer insulating film 5. Therefore, in a portion where the wires 1 and 2 intersect each other, the wires must be rearranged so that one wire is located above the other so as to interpose the interlayer insulation film 5.

In the present example, the wire 1 is disrupted at both sides of the grounding wire 2. The disrupted ends of the wire 1 are electrically connected to a polysilicon wire 3 via contact holes 3a, the polysilicon wire 3 being formed below the signal wire 1 with the interlayer insulation film 5 interposed therebetween. The polysilicon wire 3 is formed by patterning a polysilicon layer formed on the insulation film 6 provided on the surface of the substrate 4. Part of the polysilicon layer may be used as components of transistors, etc. constituting signal processing circuits to be connected by the signal wire 1. In other words, the polysilicon wire 3 is formed simultaneously with the components of the transistors. The wire 3, which is formed by thus patterning the polysilicon layer, is insulated from the wires 1 and 2 (formed by patterning the above-mentioned aluminum layer) by the interlayer insulation film 5.

Furthermore, an $N^+$ the diffusion region 7, in which impurity atoms are diffused, is formed in a region of the surface of the semiconductor substrate 4 where the semiconductor substrate 4 opposes the polysilicon wire 3, so that the insulation film 6 is sandwiched between the polysilicon wire 3 and the $N^+$ type diffusion region 7. The $N^+$ type diffusion region 7 is connected to a wire portion 1a via a contact hole 7a, so that the wire portion 1a and the $N^+$ type diffusion region 7 serve as a dummy signal wire. The wire portion 1a may be formed by patterning the Al layer simultaneously with the signal wire 1 and the grounding wire 2. A signal having the same phase as that supplied to the signal wire 1 is supplied to the portion 1a of the dummy signal wire.

Thus, the $N^+$ type diffusion region 7, which functions as a wire to which a signal having the same phase as that supplied to the signal wire 1 (and therefore the polysilicon wire 3), is located between the polysilicon wire 3 and the semiconductor substrate 4 (which is a conductive region at a different potential from the polysilicon wire 3) where the signal wire 1 and the grounding wire 2 intersect each other.

It would seem possible to realize a three-dimensional intersection of the signal wire 1 and the grounding wire 2 by using metal wires of a multilayer structure. However, the use of such metal wires having a multilayer structure leads to an increase in the production cost. Therefore, although a multilayer structure is possible in some embodiments, it is preferable to employ wires of a minimum number of layers in order to reduce the production cost of the semiconductor device.

On the other hand, the $N^+$ diffusion region 7 according to the present example is formed concurrently with diffusion layers functioning as a source region and a drain region, which are formed in the fabrication process of a transistor (where the source and drain regions are formed before the formation of a gate). The $N^+$ diffusion region 7 serves as a portion of the dummy signal wire through which a signal having the same phase as that supplied to the signal wire 1 is transmitted. As a result, no additional step for forming a new layer is required.

FIG. 1C is a circuit diagram showing a buffer circuit composed of the wiring shown in FIG. 1A and invertors 13 and 15. As shown in FIG. 1C, the preceding invertor 13 (functioning as a first signal process circuit) and the subsequent invertor 15 (functioning as a second signal process circuit) are interconnected with each other via the above-described signal wire 1. A wiring resistance 8 of the polysilicon 3 is present between the invertors 13 and 15. The input of the preceding invertor 13 and the input of a dummy invertor 14 are coupled with each other, so that a signal having the same phase is supplied to the signal wire 1 and the dummy signal wire. Moreover, the output of the dummy invertor (functioning as a dummy signal process circuit) 14 is connected to the dummy signal wire (including the $N^+$ diffusion region 7). The dummy signal wire has a wiring resistance 9 due to the $N^+$ diffusion region 7.

Since the portion of the signal wire 1 which intersects the grounding wire 2, i.e., the polysilicon wire 3, opposes the grounding wire 2 with the interlayer insulation film 5 interposed therebetween, a parasitic capacitance 10 is created between the signal wire 1 and the grounding wire 2. Since the $N^+$ diffusion region 7 is correspondingly formed on the surface of the substrate 4 below the polysilicon wire 3, a parasitic capacitance 11 is created between the signal wire 1 and the dummy signal wire 1a. Furthermore, a parasitic capacitance 12, as a junction capacitance, is present between the $N^+$ diffusion region 7 and the semiconductor substrate 4. The semiconductor substrate 4, as well as the grounding wire 2, is coupled to the grounding potential.

Figure 2:
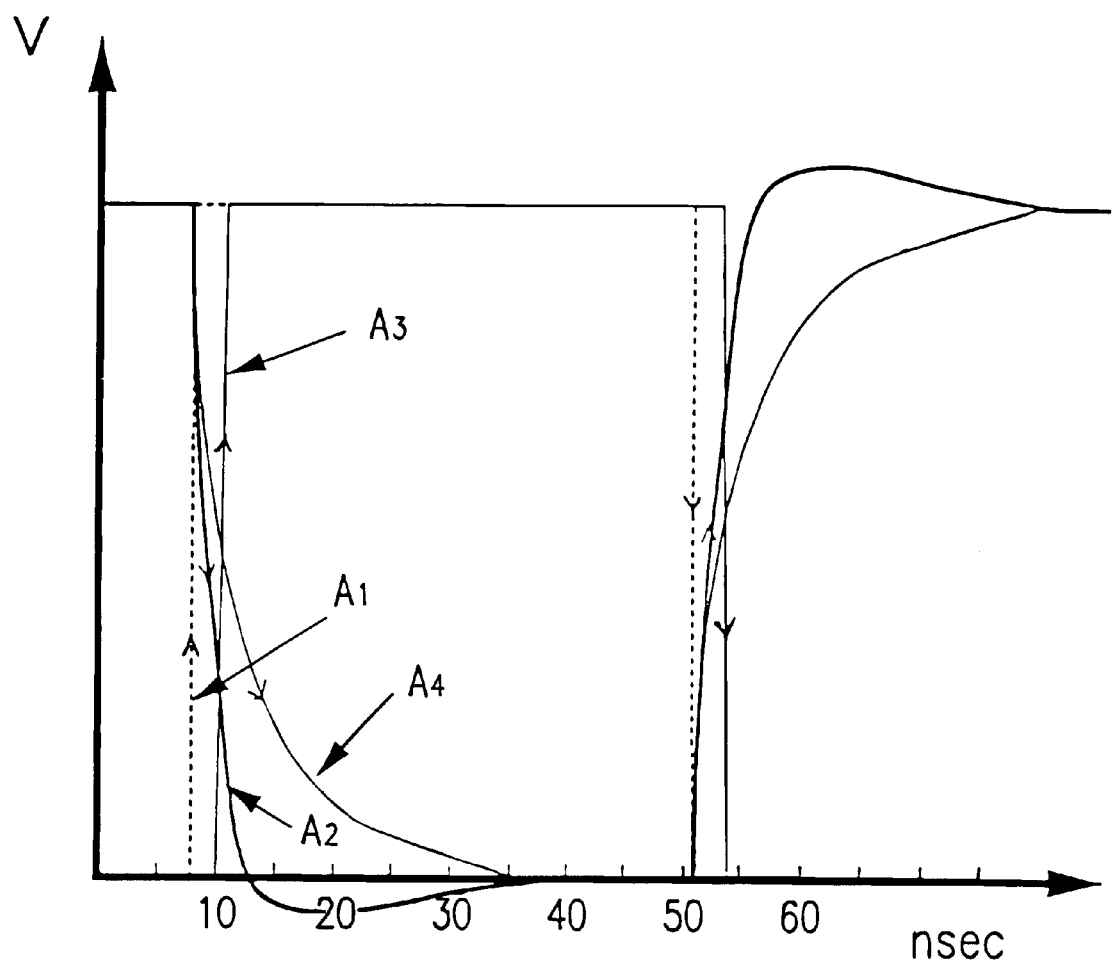
FIG. 2 is a graph showing a simulated result of the buffer circuit in the semiconductor device according to Example 1 of the present invention.

FIG. 2 shows a simulated result of the buffer circuit shown in FIG. 1C. Specifically, FIG. 2 shows signal waveforms $A_2$ and $A_4$ obtained at the respective output nodes of the invertors 13 and 14 and a signal waveform $A_3$ obtained at the output node of the subsequent invertor 15 when an input signal $A_1$ is applied to the input nodes of the invertor 13 and the dummy invertor 14.

When the input signal $A_1$ is applied to the input nodes of the invertors 13 and 14, the invertors 13 and 14 output separate signals $A_2$ and $A_4$ having the same phase, and the subsequent invertor 15 outputs the signal $A_3$. Due to a coupling effect between the output signal $A_2$ of the invertor 13 and the output signal $A_4$ of the dummy invertor 14, the signal wire 1 interconnecting the preceding invertor 13 and the subsequent invertor 15 is driven at a high speed. As a result, in accordance with the buffer circuit of the present example, the delay time of the wiring resistance 8 and the wire capacitance 10 only.

Figure 5:
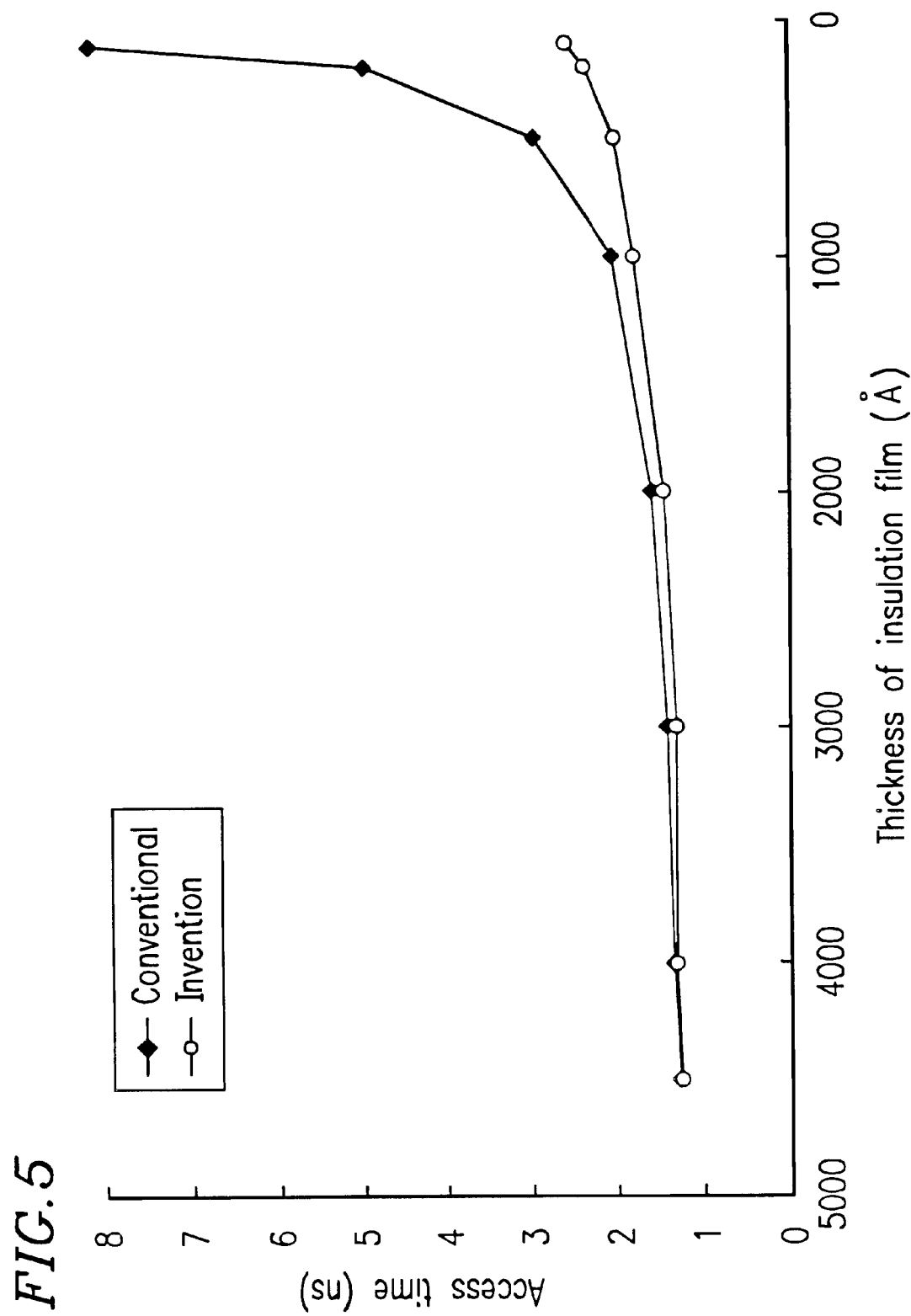
FIG. 5 is a graph showing the relationship between the insulation film thickness and the access time of the buffer circuit according to Example 1 and the relationship between the insulation film thickness and the access time of the conventional buffer circuit.

FIG. 5 shows the relationship between the thickness of the insulation film 6 and the access time of the buffer circuit according to the present example and the relationship between the thickness of the insulation film 106 and the access time of the conventional buffer circuit. For example, under the conditions that the polysilicon layer has a wiring length of 600 μm, a width of 4 μm, and a sheet resistance of 5Ω/□ and the $N^+$ diffusion region 7 has a sheet resistance of 130 Ω/□, the following is observed. When the thickness of the insulation films 5 and 105 becomes equal to or smaller than 1000 angstroms, the access time of the conventional buffer circuit is drastically delayed, but the access time of the buffer circuit of the present example does not substantially change.

Figure 6:
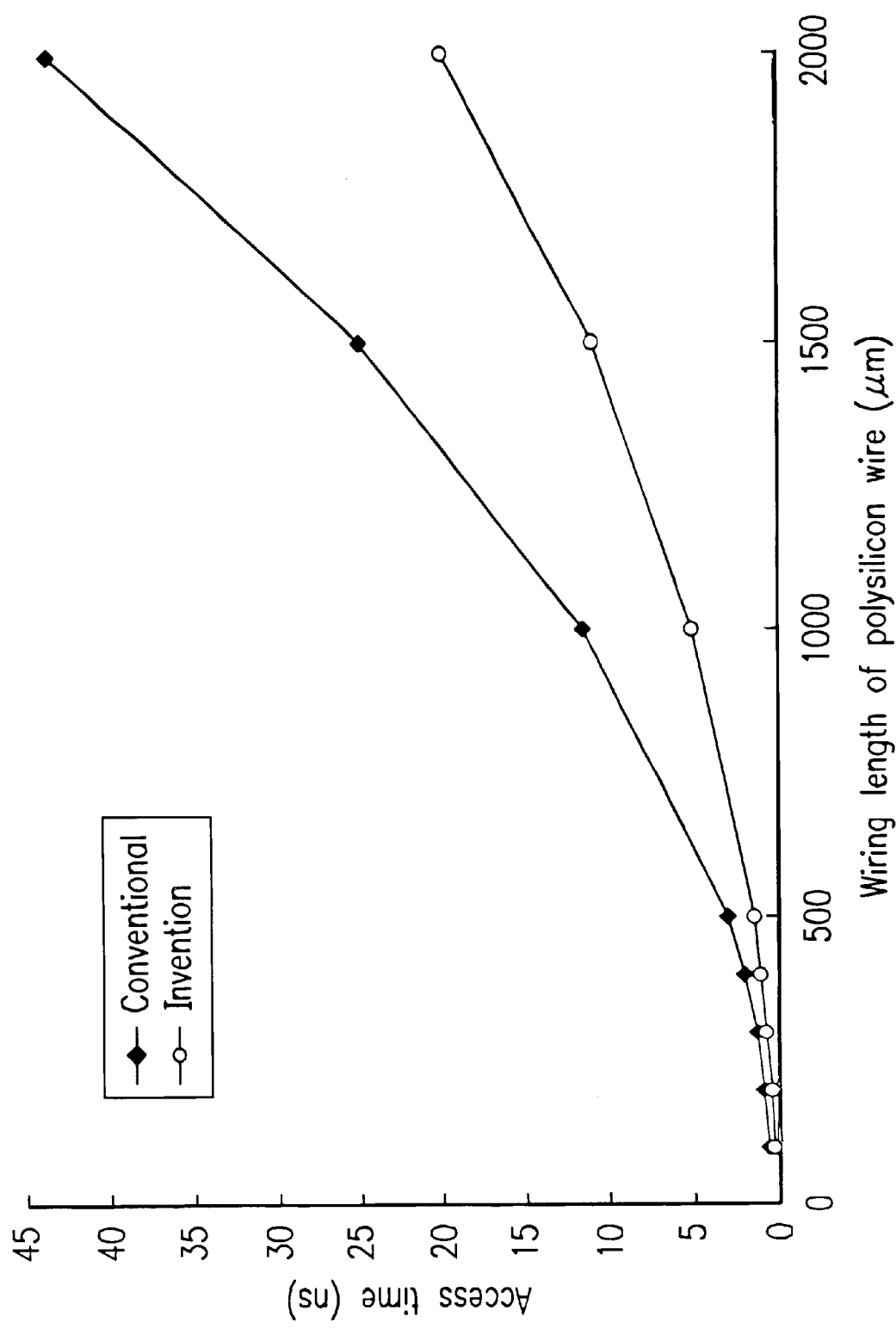
FIG. 6 is a graph showing the relationship between the wire length of a polysilicon wire and the access time of the buffer circuit according to Example 1 and the relationship between the wire length of a polysilicon wire and the access time of the conventional buffer circuit.

FIG. 6 shows the relationship between the wiring length of the polysilicon wire 3 and the access time of the buffer circuit according to the present example and the relationship between the wiring length of the polysilicon wire 103 and the access time of the conventional buffer circuit. For example, under the output signal $A_3$ with respect to the input signal $A_1$ is greatly reduced as compared with the delay time of the output signal $B_3$ with respect to the input signal $B_1$ of the conventional buffer circuit (see FIG. 3C). Thus, the buffer circuit of the present example is driven faster than the conventional buffer circuit.

The reason why the signal wire 1 can be driven faster is that, although the same parasitic capacitance 11 is present as in the conventional case, the parasitic capacitance 11 is invisible from the signal wire 1 because the signal $A_4$ on the dummy signal wire 1a (including the $N^+$ diffusion region 7) has the same phase as that of the signal $A_2$ on the signal wire 1 (including the polysilicon wire 3).

Specifically, the charging/discharging to the parasitic capacitance 11 due to change in voltage of the signal $A_2$ on the signal wire 1 is eliminated, so that the capacitance value of the parasitic capacitance 11 becomes substantially negligible. As a result, the delay time of the output signal $A_2$ of the invertor 13 with respect to its input signal $A_1$ is determined by a time constant which is obtained by multiplying the resistance value of the conditions that the polysilicon layer has a wiring width of 4 $\mu$m and a sheet resistance of 5$\Omega/\square$; the $N^+$ diffusion region 7 has a sheet resistance of 130 $\Omega/\square$; and the insulation film 5 and 105 have a thickness of 140 angstroms, the delay of the access time of the buffer circuit of the present example is reduced to about one-half of that of the conventional buffer circuit. This effect is outstanding especially when increasing the capacity of a semiconductor integrated circuit, which in turn increases the wiring length.

Thus, according to the present example, the $N^+$ diffusion region 7 is provided between the semiconductor substrate (conductor region) 4 and the signal wire 1 for transmitting the output of the preceding invertor 13 to the subsequent invertor 15 in such a manner that the $N^+$ diffusion region 7 is electrically insulated from the signal wire 1 and the semiconductor substrate 4, the $N^+$ diffusion region 7 being connected to an aluminum wire to define the dummy signal wire 1a. As a result, the parasitic capacitance occurring at the input node of the second signal process circuit (i.e., the subsequent invertor 15) equals the first parasitic capacitance 11 (formed between the dummy signal wire 1a and the signal wire 1) and the second parasitic capacitance 12 (formed between the dummy signal wire 1a and the semiconductor substrate 4) being serially connected. Therefore, when signals having the same phase are applied to the dummy signal wire 1a and the signal wire 1, the second parasitic capacitance 12 (between the dummy signal wire 1a and the semiconductor substrate 4) is charged or discharged responsive to a change in the potential of the dummy signal wire 1a, but the first parasitic capacitance 11 is hardly charged or discharged because the dummy signal wire 1a and the signal wire 1 forming opposing electrodes of the first parasitic capacitance 11 are substantially at the same potential. Accordingly, the delay of signals due to the parasitic capacitance occurring at the input node of the subsequent invertor 15 can be reduced, thereby preventing the miniaturization of the device and the simplification of the production process from hindering high-speed signal processing.

In addition, the semiconductor device according to the present example includes the dummy invertor (dummy signal process circuit) 14 for receiving an input signal and outputting a signal corresponding to the input signal such that the dummy invertor 14 has the same circuit structure as that of the preceding invertor 13 and the output signal of the dummy signal wire 1a is supplied to the dummy signal wire 1a. As a result, a high driving ability is provided for the dummy signal wire 1a, so that the rounding of signals in the dummy signal wire 1a due to the second parasitic capacitance 12 formed between the dummy signal wire 1a and the semiconductor substrate 4 is reduced. Thus, the similarity between the signal waveform in the dummy signal wire 1a and the signal waveform in the signal wire 1 can be further increased. As a result, the delay of signals due to the parasitic capacitance occurring at the input node of the subsequent invertor 15 can be further reduced.

Moreover, the portion of the dummy signal wire 1a which is present between the semiconductor substrate 4 and the signal wire 1 is constructed of the $N^+$ diffusion region 7 formed on the surface of the semiconductor substrate 4. The $N^+$ diffusion region 7 can be formed by the same process for forming sources and drains of transistors, so that additional steps for forming the dummy signal wire 1a is required.

Furthermore, the signal wire 1 is composed of a main wire portion of an aluminum layer having disrupted ends and a wire connecting portion (i.e., the polysilicon wire) 3 for interconnecting the disrupted ends of the main wire portion, the polysilicon wire 3 being composed of a polysilicon layer formed below the aluminum layer so as to interpose the interlayer insulation film 5. The grounding wire 2, which is formed by patterning the above-mentioned aluminum layer, is provided over the disrupted ends of the main wire portion of the signal wire 1 so as to intersect the signal wire 1. As a result, the delay of signals due to an increase in capacitance at portions where a large parasitic capacitance can be formed, e.g., the intersection between the signal wire 1 and the grounding wire 2, can be reduced.

EXAMPLE 2

Figure 7:
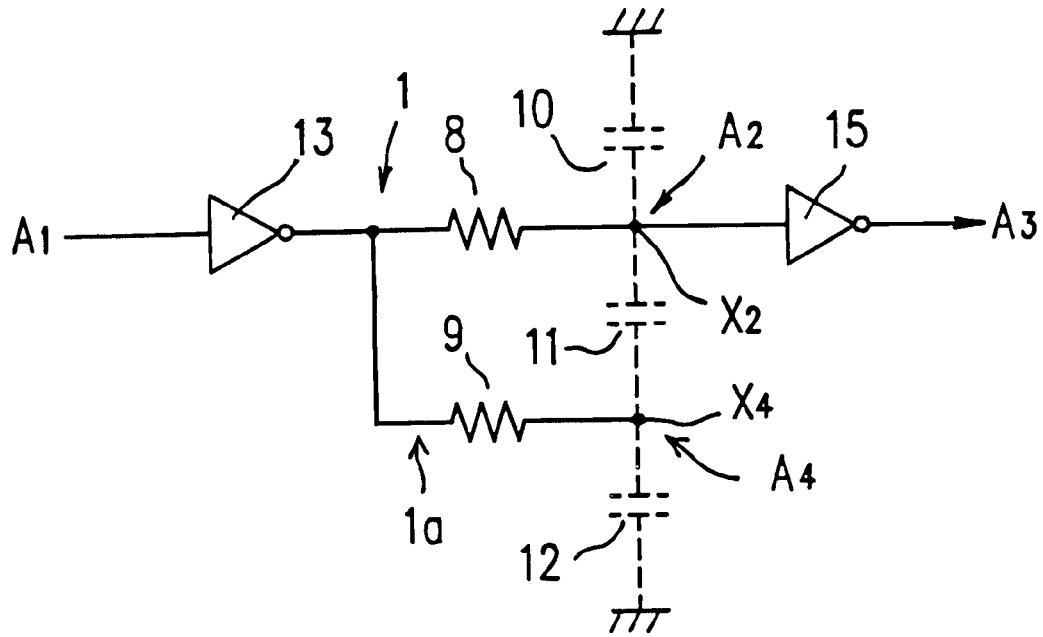
FIG. 7 is a circuit diagram showing the configuration of a buffer circuit as a semiconductor device according to Example 2 of the present invention.

FIG. 7 is a circuit diagram showing the configuration of a semiconductor device according to Example 2 of the present invention. Specifically, FIG. 7 shows a circuit corresponding to the buffer circuit of Example 1 shown in FIG. 1C.

In the buffer circuit according to the present example, the dummy signal wire 1a (including the $N^+$ diffusion region 7) is connected to the output node of the preceding invertor 13, to which the first signal wire 1 (including the polysilicon wire 3) is also connected. The dummy invertor 14 described in Example 1 is not employed in the present example. Otherwise, the buffer circuit of the present example has the same configuration as that of Example 1.

In the present example, the load on the output side of the preceding invertor 13 is increased as compared with Example 1, making any change occurring in the signal level on the output side of the invertor 13 slow. As a result, the effect of enhancing the signal processing speed of the buffer circuit obtained in the present example is smaller than that obtained in Example 1.

Hereinafter, the operation of the buffer circuit shown in FIG. 7 will be briefly described with respect to a case where an input signal $A_1$ shifts from a LOW level to a HIGH level. It is assumed that the preceding and subsequent invertors 13 and 15 are CMOS invertors each including a P-channel transistor on the high potential side end an N-channel transistor on the low potential side.

When the input signal $A_1$ is at the LOW level, the P-channel transistor of the invertor 13 is in an ON state, and a HIGH level signal is output at an input node X2 of the subsequent invertor 15 and at a node X4 on an open end of the dummy signal wire 1a. Thus, wiring capacitances 10 and 12 are charged with a potential at the HIGH level. If the input signal $A_1$ shifts to the HIGH level in this state, the P-channel transistor of the preceding invertor 13 is turned OFF, and the N-channel transistor thereof is turned ON, so that charges stored in the wiring capacitances 10 and 12 are released to a low-potential side power supply. As a result, the potentials of the signal nodes X2 and X4 shift to the LOW level. Since the difference between the potentials of the signal nodes X2 and X4 is sufficiently small, the parasitic capacitance 11 is hardly charged or discharged.

In the circuit structure shown in FIG. 7, the discharging of the wiring capacitance 12 (which delays a signal $A_4$ on the dummy signal wire 1a) affects the discharging of the wiring capacitance 10 (which delays a signal $A_2$ on the actual signal wire 1). Therefore, the effect of reducing the delay time of signals is somewhat smaller in the circuit of the present example than in the circuit of Example 1 shown in FIG. 1C, where the invertors 13 and 14 correspond to the charging/discharging of wiring capacitances 10 and 12, respectively.

In accordance with the circuit structure of the present example, the dummy signal wire is connected to the output end of the first signal process circuit, so that there is provided an advantage of supplying a signal having the same phase as that of the signal supplied to the signal wire to the dummy signal wire by only using a simple structure, in addition to the advantage of preventing the miniaturization of the device and the simplification of the production process from hindering high-speed signal processing.

EXAMPLE 3

Figure 8:
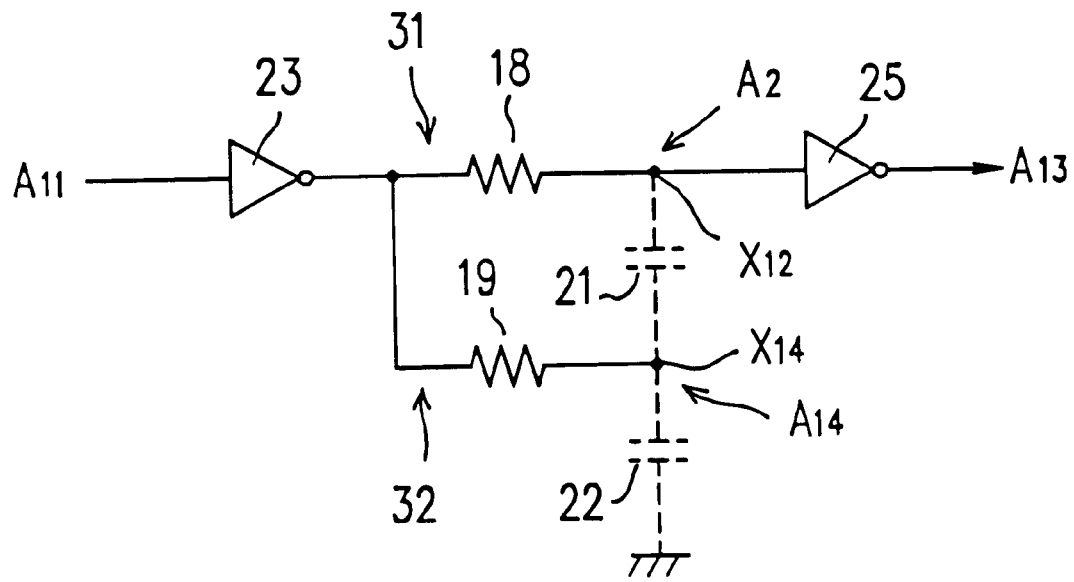
FIG. 8 is a circuit diagram showing the configuration of a buffer circuit as a semiconductor device according to Example 3 of the present invention.

FIG. 8 is a circuit diagram showing the configuration of a semiconductor device according to Example 3 of the present invention. Specifically, FIG. 8 shows a circuit corresponding to the buffer circuit of Example 2 shown in FIG. 7.

In FIG. 8, a preceding invertor 23 and a subsequent invertor 25 correspond to the invertors 13 and 15 of Example 2, respectively. The invertors 23 and 25 are interconnected via a signal wire 31 having a wiring resistance 18. A dummy signal wire 32 is connected to the output node of the preceding invertor 23. At least a portion of the dummy signal wire 32 opposes the signal wire 31 with an interlayer insulation film or the like interposed therebetween. The signal wire 31 is obtained by patterning an aluminum layer formed on the interlayer insulation film provided on the semiconductor substrate. The dummy signal wire 32 includes an N⁺diffusion region (having a wiring resistance 19) formed on the surface of the semiconductor substrate so as to oppose the signal wire 31 with an interlayer insulation film or the like interposed therebetween.

In the present example, the signal wire 31 interconnecting the preceding invertor 23 and the subsequent invertor 25 includes no portion that overlaps with overlying wires, e.g., grounding wires.

A parasitic capacitance 21 is formed between the signal wire 31 and the dummy signal wire 32, and a parasitic capacitance 22 is formed between the dummy signal wire 32 and the semiconductor substrate.

In the buffer circuit of the present example having the above-mentioned configuration, the signal wire 31 and the dummy signal wire 32 are connected to the input node of the preceding invertor 23, so that signals having the same phase are supplied to the signal wire 31 and the dummy signal wire 32. As a result, a potential $A_{12}$ of the input node X12 of the subsequent invertor 25 and an open end X14 of the dummy signal wire 32 (which forms the parasitic capacitance 21 with the input node X12) are constantly at substantially the same potential. Therefore, the capacitance value of the parasitic capacitance 21 becomes substantially negligible. Thus, the delay time of an output signal $A_{13}$ corresponding to an input signal $A_{11}$ is determined by a time constant which is based almost only on the resistance value of the wiring resistance 18. As a result, the delay time of signals can be reduced.

Although a polysilicon layer and an N⁺diffusion layer are used as a portion of the signal wire and a portion of the dummy signal wire in the above-described examples, the conductor layers constituting such signal wires are not limited to the above. For example, the dummy signal wire can be obtained by patterning a second aluminum layer provided above the aluminum layer that constitutes the signal wire, the dummy signal wire having a portion which overlaps with the signal wire with an interlayer insulation film interposed therebetween.

As in apparent from the above description, in accordance with the semiconductor device of the present invention, the delay time of signals can be reduced in spite of an increase in the capacitance of the wiring which results from a decrease in the thickness of an interlayer insulation film or an insulation film necessitated by the miniaturization of the device or the simplification of the production process thereof.

In addition, according to the present invention, the portion which is interposed between the semiconductor substrate and the signal wire can be formed by the same deposition and patterning steps of a fabrication process of various semiconductor devices on the substrate, so that no additional step is required.

Moreover, delaying of signals due to an increase in capacitance in portions where large parasitic capacitances are formed, e.g., an intersection of signal wires, can be reduced.

Furthermore, in accordance with the semiconductor device of the present invention, large driving ability for the dummy signal wire is provided, and the rounding of signals in the dummy signal wire due to a parasitic capacitance created between the dummy signal wire and the conductor region is reduced, so that the similarity between the signal waveforms in the dummy signal wire and the signal wire can be further increased. As a result, the delaying of signals due to a parasitic capacitance occurring at the input node of the subsequent signal process circuit can be further reduced.

Furthermore, in accordance with the semiconductor device of the present invention, it is possible to supply a signal having the same phase as that of the signal supplied to the signal wire to the dummy signal wire by using a simple structure.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:
1. A semiconductor device comprising:
 a semiconductor substrate;
 a signal wire, disposed on the semiconductor substrate, for transmitting a signal between circuits; and
 a dummy wire including a portion which is disposed between the signal wire and the semiconductor sub- strate to form a first parasitic capacitance with the signal wire and a second parasitic capacitance with the semiconductor substrate, wherein a signal, which has the same phase as a phase of a signal supplied to the signal wire, is supplied to the dummy wire, thereby substantially preventing the first parasitic capacitance from being charged or discharged due to a change in the signal supplied to the signal wire.

2. A semiconductor device according to claim 1, wherein the circuits include at least one transistor including a semiconductor layer, and the signal wire includes a semiconductor portion which is formed simultaneously with the semiconductor layer of the at least one transistor.

3. A semiconductor device according to claim 2, wherein the dummy wire includes an impurity diffusion region formed in a surface of the semiconductor substrate to oppose the semiconductor portion of the signal wire.

4. A semiconductor device according to claim 3, wherein the signal wire includes a first conductive portion with an insulating layer interposed between the first conductive portion and the semiconductor portion of the signal wire, the semiconductor portion being electrically connected to the first conductive portion through a first contact hole formed in the insulating layer.

5. A semiconductor device according to claim 4, wherein the dummy wire includes a second conductive portion with the insulating layer interposed between the second conductive portion and the impurity diffusion region of the dummy wire, the impurity diffusion region being electrically connected to the second conductive portion through a second contact hole formed in the insulating layer.

6. A semiconductor device according to claim 4, further comprising a further wire formed of a same material as a material of the first conductive portion of the signal wire, wherein the further wire is arranged to be located above the semiconductor portion of the signal wire with the insulating layer interposed therebetween.

7. A semiconductor device comprising:

a semiconductor substrate;

a first signal processing circuit for receiving an input signal and for outputting a first output signal in accordance with the input signal;

a second signal processing circuit for receiving the first output signal and for outputting a second output signal in accordance with the first output signal;

a signal wire, disposed on the semiconductor substrate, for connecting the first signal processing circuit to the second signal processing circuit to transmit the first output signal from the first signal processing circuit to the second signal processing circuit; and a dummy wire disposed on the semiconductor substrate substantially parallel to the signal wire, the dummy wire being electrically insulated from the signal wire, at least a portion of the dummy wire being located under the signal wire to form a first parasitic capacitance with the signal wire and a second parasitic capacitance with the semiconductor substrate, wherein a signal supplied to the dummy wire has the same phase as a phase of the first output signal transmitted by the signal wire, thereby substantially preventing the first parasitic capacitance from being charged or discharged due to a change in the first output signal.

8. A semiconductor device according to claim 7, further comprising a dummy signal processing circuit having the same configurating as a configuration of the first signal processing circuit, the dummy signal processing circuit receiving the input signal and outputting a third output signal in accordance with the input signal to the dummy wire.

9. A semiconductor device according to claim 8, wherein the signal wire includes conductive portions which are apart from each other and a connecting portion which connects the conductive portions, the conductive portions being formed of a first conductive layer, the connecting portion being formed of a second conductive layer disposed under the first conductive layer with an insulating layer interposed therebetween, and wherein a further wire, formed of the first conductive layer, is provided above the connecting portion of the signal wire.

10. A semiconductor device according to claim 7, wherein the dummy wire is connected to an output terminal of the first signal processing circuit.

11. A semiconductor device according to claim 7, wherein at least one of the first signal processing circuit and the second signal processing circuit is an inverter circuit.

12. A semiconductor device comprising:

a semiconductor substrate;

a signal wire including first portions and a second portion positioned lower than the first portions, the signal wire being disposed on the semiconductor substrate; and a dummy wire including a portion which is located under the second portion of the signal wire and forms a first capacitance with the second portion of the signal wire, the portion of the dummy wire being an impurity diffusion region formed in the semiconductor substrate and forming a second capacitance with the semiconductor substrate, wherein a signal, which has the same phase as a phase of a signal supplied to the signal wire, is supplied to the dummy wire so as to substantially prevent the first capacitance from being charged or discharged due to a change in the signal supplied to the signal wire.

* * * * *